United States Patent
Landa et al.

(10) Patent No.: US 8,998,621 B2
(45) Date of Patent: Apr. 7, 2015

(54) SOCKET MOUNT

(71) Applicant: Titan Semiconductor Tool, LLC, Ladera Ranch, CA (US)

(72) Inventors: Victor Landa, Ladera Ranch, CA (US); Pongsak Tiengtum, Ladera Ranch, CA (US); Dan Mashayekh, Irvine, CA (US)

(73) Assignee: Titan Semiconductor Tool, LLC, Ladera Ranch, CA (US)

( * ) Notice: Subject to any disclaimer, the term of this patent is extended or adjusted under 35 U.S.C. 154(b) by 0 days.

(21) Appl. No.: 14/136,931

(22) Filed: Dec. 20, 2013

(65) Prior Publication Data

US 2014/0235096 A1     Aug. 21, 2014

Related U.S. Application Data

(63) Continuation-in-part of application No. 13/769,120, filed on Feb. 15, 2013, now Pat. No. 8,758,027.

(51) Int. Cl.
| | |
|---|---|
| *H01R 12/00* | (2006.01) |
| *H01L 23/32* | (2006.01) |
| *G01R 1/04* | (2006.01) |
| *H01L 23/00* | (2006.01) |
| *H01R 12/71* | (2011.01) |

(52) U.S. Cl.
CPC ........ *H01L 23/32* (2013.01); *G01R 1/04* (2013.01); *H01L 24/00* (2013.01); *H01R 12/714* (2013.01)

(58) Field of Classification Search
USPC ............. 439/66, 71, 73, 68, 493; 324/756.02, 324/754.03
See application file for complete search history.

(56) References Cited

U.S. PATENT DOCUMENTS

| | | | | |
|---|---|---|---|---|
| 4,515,425 | A  * | 5/1985  | Nakano ........................... | 439/73 |
| 4,969,828 | A  * | 11/1990 | Bright et al. .................... | 439/68 |
| 6,409,521 | B1   | 6/2002  | Rathburn | |
| 7,688,094 | B2 * | 3/2010  | Osato ....................... | 324/754.03 |
| 7,737,708 | B2   | 6/2010  | Sherry | |
| 7,918,669 | B1 * | 4/2011  | Tiengtum ........................ | 439/66 |
| 2014/0167805 | A1 * | 6/2014  | Dell et al. ................ | 324/756.02 |

* cited by examiner

*Primary Examiner* — Jean F Duverne
(74) *Attorney, Agent, or Firm* — Fulwider Patton LLP

(57) ABSTRACT

A socket mount for use in connection with an integrated circuit test socket having a body with fastener holes, a plurality of electrical connector links, and a plurality of elastomer elements biasing said links, the socket mount comprising a block having a flat upper surface, a flat lower surface, and four flat edges defining a square, and respective fastener holes aligned with the fastener holes in the test socket, a first groove oriented perpendicularly with respect to a flat edge along the flat lower surface, and a second groove oriented diagonally from a first edge to a second edge along the flat lower surface, the grooves having a length equal to a length of elastomer in the test socket.

5 Claims, 2 Drawing Sheets

SOCKET MOUNT

CROSS-REFERENCES TO RELATED APPLICATIONS

This application is a continuation-in-part application that claims priority from U.S. application Ser. No. 13/769,120, filed Feb. 15, 2013, incorporated by reference in its entirety.

BACKGROUND

The present invention relates to sockets that electrically connects an integrated circuit with an IC board. More particularly, the present invention is directed to a backing plate for such a socket, used to ship the sockets and protect them from damage, and also includes specially designed grooves for cutting elastomer components of the test socket, allowing precise fitting of the elastomers for use with such sockets.

Integrated circuit tester devices have long been used in the semiconductor industry to test and evaluate the quality of the chips off the manufacturing line. Signal integrity is a critical aspect of chip design and testing. To this end, it is desirable to maintain impedance through a conducting portion of a contact interconnecting the integrated circuit lead to its corresponding load board pad at a particular desired level. The effective impedance of the design is a function of a number of factors. These include width and length of conduction path, material of which the conductive structure is made, material thickness, etc.

When testing the electrical characteristics of a packaged or molded semiconductor device such as an integrated circuit (IC), it is common to utilize a specialized test socket that secures and connects the IC to the equipment that evaluates its performance, i.e. a load board. Many different test sockets have been devised for quickly and temporarily connecting integrated circuit leads of a chip to be tested to a load board of a tester. Automated test apparatus in particular use a number of such sockets. Typical socket arrangements use force brought to bear upon a contact positioned between a lead of the IC and the load board to deform a probe tip of the contact and engage a pad on the load board. Such a configuration provides for positive connection between the pins or contact pads of the DUT and corresponding leads of a test apparatus. Examples of this type of connection can be found, for example, in U.S. Pat. No. 6,409,521 to Rathburn, and U.S. Pat. No. 7,737,708 to Sherry, the teachings and contents of both of which are fully incorporated herein by reference.

U.S. Pat. No. 7,918,669, the contents of which are incorporated herein by reference, is a test socket devised by the present inventor. The socket of the '669 patent uses a unique linkage to urge the connectors of the test circuit upward where it can make contact with the test equipment. This test socket was found to be very successful in ensuring good contact with the test apparatus while reducing force on the circuit itself. A component of that test socket was an elastomer element that provided a resiliency to the link, ensuring proper contact in a cost effective and reliable manner. The cylindrical elastomer keeps the contact links in place, and their resiliency acts like a spring mechanism for the links. This allows for vertical movement on the link.

When such test sockets are shipped, they are accompanied by a shipping back plate, or socket mount, that is essentially a protective structure created to hold the socket in place. This socket mount contains fastener holes on the outside corresponding to the holes on the socket, so that the screw and pins can go through the back plate and the socket can sit flush. These back plates are either discarded once the socket is received by the user, or reused in some cases. The Applicant of the present invention has devised a secondary use for the socket mount, which is particular to the test socket of the '669 patent.

SUMMARY OF THE INVENTION

The present invention is directed to a socket mount for an integrated circuit test socket that can be used to measure and cut a length of elastomer for use in the test socket. While its initial use is a socket holder and for shipment, the back plate of the present invention has specially designed grooves on the backside used for cutting elastomers to the appropriate length as required by the particular test socket and application. The socket mount has multiple corresponding groove sizes to establish all the elastomers needed for that specific socket.

These and many other features of the present invention will best be understood by reference to the following descriptions and figures. However, it is to be understood that while the inventor's best mode has been described and shown, the invention is not to be limited to any particular drawing or description. Rather, it is understood that there may be many variations of the present invention that would be readily appreciated by one of ordinary skill in the art, and the invention encompasses all such variations and modifications.

DETAILED DESCRIPTION OF THE PREFERRED EMBODIMENTS

Figure 1:
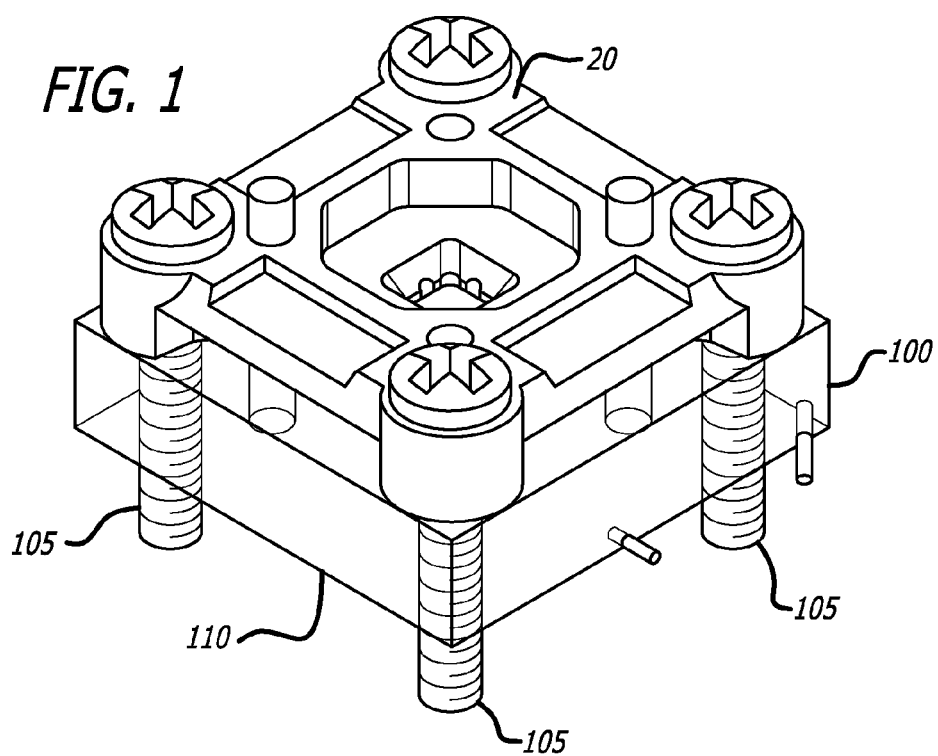
FIG. 1 is an elevated, perspective view of an embodiment of the socket mount and test socket of the present invention.
Figure 2:
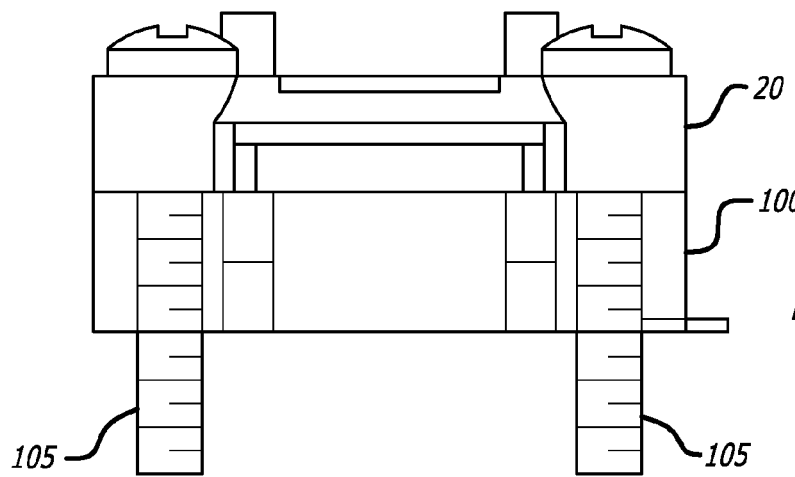
FIG. 2 is a top view of the test socket and socket mount of FIG. 1.

FIGS. 1 and 2 illustrate an integrated circuit test socket 20 of the type described in U.S. Pat. No. 7,918,669, the contents of which are incorporated herein. The details of the test socket is omitted herein for brevity. Mounted to the test socket 20 is a socket mount 100 which is also a shipping plate, secured to the test socket 20 by four fasteners 105. The socket mount 100 includes holes coinciding with the holes in the test socket 20 so that the fasteners 105 can pass through the socket mount 100, allowing the test socket 20 to sit flush against the socket mount 100. The fasteners 105 extend beyond a lower surface 110 of the socket mount 100 in order that the combination can further be secured to a larger structure for shipping, immobilizing the socket and protecting the socket from damage during shipping.

Figure 3:
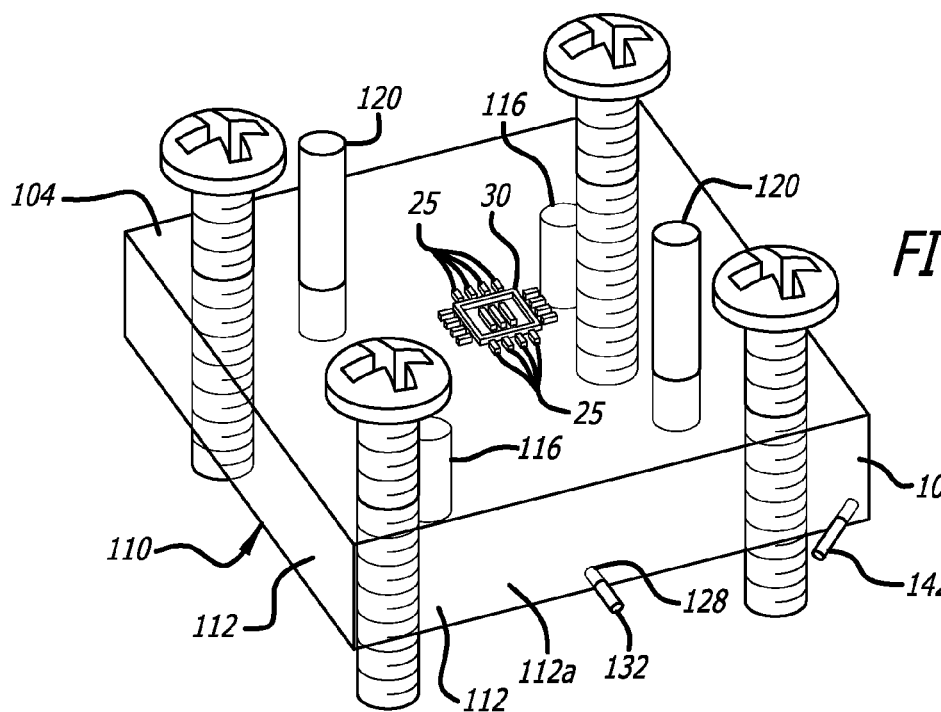
FIG. 3 is an elevated, perspective view of the socket mount with the body of the test socket removed.
Figure 4:
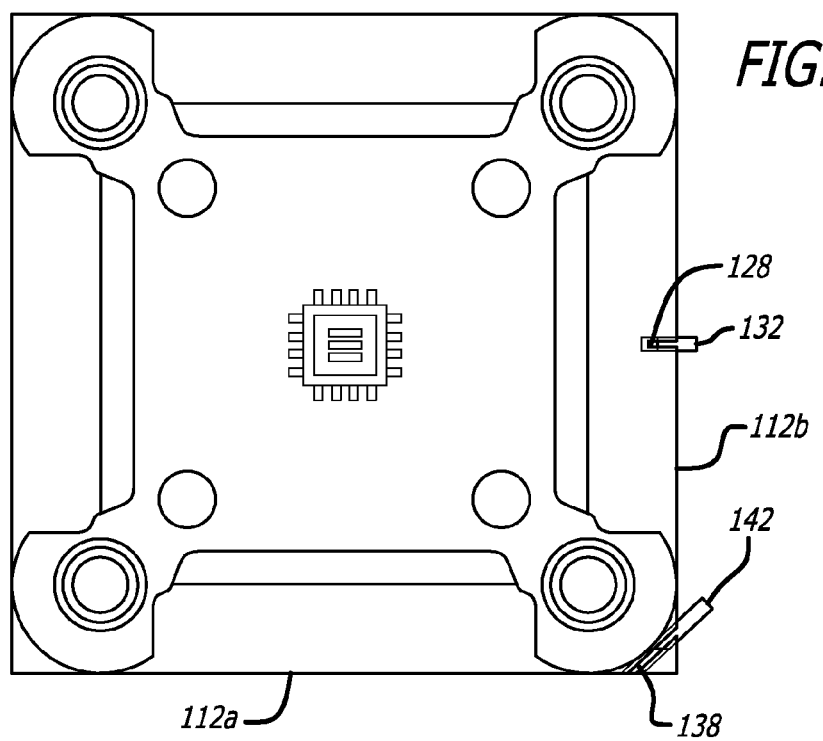
FIG. 4 is a top view of the socket mount illustrating the cutting slots.

The socket mount 100, which is shown in greater detail in FIG. 3, may be made of acrylic and includes a flat upper surface 104, a flat lower surface 110, and four flat edges 112 cooperating to form a square block. The flat upper surface 104 may include four cylindrical recesses 116 that are sized to receive complementary pins 120 on the test socket 20, further assisting in aligning the two components. FIG. 3 further illustrates the test element of the test socket 20, comprising a series of links 25 that form electrical connectors with an integrated circuit, supported by an elongate cylindrical elastomer 30. As set forth in U.S. Pat. No. 7,918,669, the elongate cylindrical elastomer 30 provides a resiliency to the links 25, enabling a reliable contact between the links 25 and the associated electrical connection points on the integrated circuit (not shown). When the test socket is shipped, typically a length of the elastomer is included so that the elastomer can be inserted into the test socket prior to use. Because a precise fit of the elastomer is essential in the operation of the test socket, obtaining the correct length of elastomer is an important step in the pre-test set-up. The socket mount 100 of the present invention allows precise measurement and cutting of the elastomer for use in the associated test socket.

On a first edge 112a of the socket mount 100 along the bottom surface, a perpendicular elongate slot 128 is formed at the bottom of the acrylic block, having a length that is exactly equal to the length of the cylindrical elastomer needed in the operation of the test socket 20. In order to set up the test socket 20, a length of elastomer is placed into the slot 128 until it is flush with the end of the slot 128. Then using a cutting tool, the exposed length of the elastomer is cut against the edge 112a of the socket mount 100, and the remaining length of elastomer 132 is the correct length for the test socket 20. The elastomer is removed from the slot 128 and install into the socket.

In addition to making straight cuts at the appropriate length, the socket mount 100 can also be used to make corner cuts. A diagonal slot 138 is additionally formed on the bottom surface 110 of the socket mount 100, connecting edge 112a to edge 112b, where the length of the groove is the length of the test socket test area side. The elastomer is placed over the diagonal slot 138 until it is protruding from both edges, and then the elastomer is cut at both edges. This provides a perfectly cut elastomer segment 142 with 45 degree cuts on both ends, allowing the elastomer 142 to sit into the test socket flush with another corner elastomer.

The socket mount 100 can be formed with multiple grooves to accommodate multiple test socket sizes, allowing greater flexibility and interchangeability for a single socket mount configuration. The grooves for the socket mount 100 can be, in a first embodiment, perpendicular grooves of 0.420 mm and 1.108 mm, and a diagonal groove of 2.000 mm. Other lengths are of course possible, depending upon the needs of the user.

It will be understood that this disclosure is merely illustrative, and that it is to be further understood that changes may be made in the details, particularly in matters of shape, size, material, and arrangement of parts without exceeding the scope of the invention. Accordingly, the scope of the invention is as defined in the language of the appended claims, and is not limited in any manner by the aforementioned descriptions and drawings.

We claim:

1. A socket mount for use in connection with an integrated circuit test socket having a body with fastener holes, a plurality of electrical connector links, and a plurality of elastomer elements biasing said links, the socket mount comprising:
    a block having a flat upper surface, a flat lower surface, and four flat edges defining a square, and respective fastener holes aligned with the fastener holes in the test socket;
    a first groove oriented perpendicularly with respect to a flat edge along the flat lower surface, said first groove having a length equal to a length of elastomer in the test socket; and
    a second groove oriented diagonally from a first edge to a second edge along the flat lower surface, the second groove having a length equal to a length of elastomer in the test socket.

2. The socket mount of claim 1, further comprising first and second pin-receiving vertical apertures in the upper surface.

3. The socket mount of claim 1, wherein the block is made of acrylic.

4. The socket mount of claim 1, wherein the second groove makes an angle of forty-five degrees with its respective first and second edges.

5. The socket mount of claim 1, further comprising a plurality of fasteners for coupling the socket mount to a test socket.

* * * * *